US006354479B1

(12) United States Patent
Reiber et al.

(10) Patent No.: US 6,354,479 B1
(45) Date of Patent: Mar. 12, 2002

(54) DISSIPATIVE CERAMIC BONDING TIP

(75) Inventors: Steven Frederick Reiber, Sunnyvale; Mary Louise Reiber, Los Altos, both of CA (US)

(73) Assignee: SJM Technologies, Mountain View, CA (US)

( * ) Notice: Subject to any disclaimer, the term of this patent is extended or adjusted under 35 U.S.C. 154(b) by 0 days.

(21) Appl. No.: 09/514,454

(22) Filed: Feb. 25, 2000

Related U.S. Application Data (60) Provisional application No. 60/121,694, filed on Feb. 25, 1999.

(51) Int. Cl.[7] .......................... B23K 37/00; B23K 1/00; B23K 5/00
(52) U.S. Cl. ....................... 228/4.5; 228/180.5; 228/6.1; 228/6.2; 219/56.21
(58) Field of Search ............................... 228/4.5, 180.5, 228/6.1, 6.2; 219/56.21

(56) References Cited

U.S. PATENT DOCUMENTS

| | | | |
|---|---|---|---|
| 2,892,924 A | 6/1959 | Wood | 219/118 |
| 3,538,205 A | * 11/1970 | Gates, Jr. et al. | 264/61 |
| 3,660,050 A | * 5/1972 | Iler et al. | 29/182.8 |
| 3,986,653 A | * 10/1976 | Gilding | 228/44.1 A |
| 4,020,543 A | * 5/1977 | Pennings | 29/423 |
| 4,171,477 A | * 10/1979 | Funari | 219/56.21 |
| 4,182,947 A | 1/1980 | Brower | 219/70 |
| 4,315,128 A | * 2/1982 | Matcovich et al. | 219/85 |
| 4,331,048 A | * 5/1982 | Dworak et al. | 82/1 |
| 4,387,283 A | 6/1983 | Peterson et al. | 219/56.21 |

(List continued on next page.)

FOREIGN PATENT DOCUMENTS

| | | | | |
|---|---|---|---|---|
| EP | 0435423 A2 | * 7/1991 | | 228/4.5 |
| GB | 2287897 A | * 10/1995 | | 228/4.5 |
| JP | 54037114 | * 3/1979 | | 228/4.5 |
| JP | 63164228 | * 7/1988 | | 228/4.5 |

OTHER PUBLICATIONS

Newburg, Carl E., "Test Report", Anza Technolgy, Incorporated Static Dissipative Ceramic Rods for Wire Bonding Applications, Report 190 :2000–92, River's Edge Technical Service, Nov. 29, 2000, pp. 1–5.*
James R. Huntsman and Donald M. Yenni, Jr., "Test Methods for Static Control Products," Electrical Overstress/Electrostatic Discharge Symposium Proceedings, Sep. 21, 1982, pp. 94–109, vol. 4, IIT Research Institute, Chicago, IL.
Carl E. Newberg, "Test Report," Anza Technology, Incorporated Static Dissipative Ceramic Rods for Wire Bonding Applications, Tested for Electrical Properties Discharge Current Resistance and Decay Time, Report #: 2000–92, River's Edge Technical Service, Nov. 29, 2000, pp. 1–5.
Stan Weitz, "Trends in ESD Test Methods, " Materials Testing Section of the ETS Testing Laboratory, Electrotech Systems, http://www.electrotechsystems.com, the website has a copyright of 1998, pp. 1–7.

(List continued on next page.)

Primary Examiner—Tom Dunn
Assistant Examiner—L. Edmondson
(74) Attorney, Agent, or Firm—Carr & Ferrell LLP; John S. Ferrell; Davis Lewis (57) ABSTRACT

Dissipative ceramic bonding tips for wire bonding electrical connections to bonding pads on integrated circuits chips and packages are disclosed. In accordance with the principles of the present invention, to avoid damaging delicate electronic devices by any electrostatic discharge, an ultrasonic bonding wedge tool tip must conduct electricity at a rate sufficient to prevent charge buildup, but not at so high a rate as to overload the device being bonded. For best results, a resistance in the tip assembly itself should range from $10^5$ to $10^{12}$ ohms. In addition, the wedges must also have specific mechanical properties to function satisfactorily.

51 Claims, 4 Drawing Sheets

TIP DETAIL

U.S. PATENT DOCUMENTS

| | | | |
|---|---|---|---|
| 4,390,771 A | | 6/1983 | Kurtz et al. ............ 219/56.22 |
| 4,502,983 A | * | 3/1985 | Omori et al. ............... 252/516 |
| 4,513,190 A | * | 4/1985 | Ellet et al. ............... 219/56.21 |
| 4,691,854 A | * | 9/1987 | Haefling et al. ............. 228/4.5 |
| 4,705,204 A | | 11/1987 | Hirota et al. ............... 228/179 |
| 4,897,710 A | * | 1/1990 | Suzuki et al. ................. 357/71 |
| 4,909,427 A | * | 3/1990 | Plaisted et al. ............. 228/4.5 |
| 4,998,002 A | | 3/1991 | Okikawa et al. ......... 219/56.22 |
| 5,178,742 A | | 1/1993 | Lemke et al. .......... 204/129.55 |
| 5,180,093 A | * | 1/1993 | Stansbury et al. ........... 228/1.1 |
| 5,214,259 A | | 5/1993 | Terakado et al. ........ 219/56.22 |
| 5,217,154 A | * | 6/1993 | Elwood et al. .............. 228/4.5 |
| 5,280,979 A | * | 1/1994 | Poli et al. .................. 294/64.1 |
| 5,290,507 A | * | 3/1994 | Runkle ........................ 419/14 |
| 5,367,956 A | * | 11/1994 | Fogle, Jr. ................. 102/202.2 |
| 5,463,197 A | | 10/1995 | Miyazaki ................. 219/56.22 |
| 5,463,896 A | | 11/1995 | Abbate et al. |
| 5,491,605 A | | 2/1996 | Hughbanks et al. |
| 5,527,441 A | | 6/1996 | Offer .......................... 204/280 |
| 5,544,804 A | * | 8/1996 | Test et al. ................ 228/180.5 |
| 5,601,740 A | | 2/1997 | Eldridge et al. ......... 219/130.4 |
| 5,616,257 A | | 4/1997 | Harada et al. ............ 219/56.21 |
| 5,649,355 A | | 7/1997 | Offer ........................... 29/825 |
| 5,651,901 A | | 7/1997 | Mohri et al. ............. 219/69.17 |
| 5,676,856 A | | 10/1997 | Haji et al. ............... 219/56.21 |
| 5,797,388 A | | 8/1998 | Nakamura et al. ....... 228/180.5 |
| 5,816,472 A | * | 10/1998 | Linn .......................... 228/1.1 |
| 5,827,470 A | * | 10/1998 | Chatterjee et al. .......... 264/604 |
| 5,931,368 A | * | 8/1999 | Hadar et al. ................. 228/4.5 |
| 6,030,472 A | * | 2/2000 | Hajaligol et al. ........... 148/651 |
| 6,073,827 A | * | 6/2000 | Razon et al. ................ 228/4.5 |

OTHER PUBLICATIONS

Instrument FAQs, Drivers, Libraries and Examples, Keithley Instruments Model 6517/6517A, http://208.240.90.52/techsupport/instruments/kth6517a.html, Keithley Instruments, Inc., 1999, pp. 1–2.

Keithley Instruments Model 6517A Electometer/High Resistance Meter, http://208.240.90.52/products/prod_pages . . . K13_pages/summary_pgs/6517A_Summary.html, Keithley Instruments, Inc., This or an equivalent was in use for testing the Applicants' invention, earlier than Feb. 25, 1999, pp. 1–9.

"Low–Current /High–Resistance Meters," Keithley Instruments Model 6517A Electrometer/High Resistance Meter, www.keithley.com, Keithley Instruments, Inc., This or an equivalent was in use for testing the Applicants' invention earlier than Feb. 25, 1999, pp. 112–115.

Keytech 200 XV–2 ESD Simulator, http://www.kandus.com/Configurations/KEYTECH16842.html, K & Us Equipment, p. 1.

* cited by examiner

BOTTLE-NECK CAPILLARY
FIG. 3

NORMAL CAPILLARY
FIG. 2

FIG. 5b
TIP DETAIL

FIG. 6B
Transducer Horn Tip and Wedge Detail

TIP DETAIL
FIG. 9

BOTTLE-NECK CAPILLARY
FIG. 8

NORMAL CAPILLARY
FIG. 7

DISSIPATIVE CERAMIC BONDING TIP

CROSS REFERENCE TO RELATED APPLICATIONS

This application claims benefits of Provisional Application Ser. No. 60/121,694, filed Feb. 25, 1999, entitled Dissipative Ceramic Bonding Tip.

BACKGROUND OF THE INVENTION

Field of the Invention

This invention relates to bonding tool tips and more particularly to dissipative ceramic bonding tips for bonding electrical connections.

Description of the Prior Art

Integrated circuits are typically attached to a lead frame, and individual leads are connected to individual bond pads on the integrated circuit with wire. The wire is fed through a tubular bonding tool tip having a bonding pad at the output end. These tips are called capillary tips. An electrical discharge at the bonding tool tip supplied by a separate EFO (electronic flame off) device melts a bit of the wire, forming a bonding ball. Other bonding tools do not have the center tube, but have a feed hole or other feature for feeding the wire along, as needed. Some bonding tips have no such wire arrangement, as the wire is supplied, as in magnetic disk recording devices, where the wire is insulated and bonded to a magnetic head and then to a flexible wire circuit.

When the bonding tip is on the integrated circuit die side of the wire connection, the wire will have a ball formed on the end of the wire, as above, before reaching the next die bonding pad. The ball then makes intimate contact with the film formed on the die pad on the integrated circuit. The bonding tip is then moved from the integrated circuit die pad, with gold wire being fed out as the tool is moved, onto the bond pad on the lead frame, and then scrubbed laterally by an ultrasonic transducer. Pressure from the bonding tool tip and the transducer, and capillary action, 'flows' the wire onto the bonding pad where molecular bonds produce a reliable electrical and mechanical connection.

Bonding tool tips must be sufficiently hard to prevent deformation under pressure, and mechanically durable so that many bonds can be made before replacement. Prior art bonding tool tips were made of aluminum oxide, which is an insulator, but provides the wearability to form thousands of bonding connections. Bonding tool tips must also be electrically designed to produce a reliable electrical contact, yet prevent electrostatic discharge damage to the part being bonded. Certain prior art devices have a one or more volt emission when the tip makes bonding contact. This could present a problem, as a one volt static discharge could generate a 20 milliamp current to flow, which, in certain instances, could cause the integrated circuit to fail due to this unwanted current.

U.S. Pat. No. 5,816,472 to Linn describes a durable alumina bonding tool "without electrically conductive metallic binders." U.S. Pat. No. 5,616,257 to Harada describes covering the bonding tool electrode with an insulating cap or covering "made of a ceramic material" to produce a large electrostatic discharge that creates bonding balls of stable diameter. U.S. Pat. No. 5,280,979 to Poli describes a vacuum wafer-handling tool having a ceramic coating "made with a controlled conductivity" to prevent a large electrostatic discharge.

SUMMARY OF THE INVENTION

Electrically, dissipative ceramic bonding tips for bonding electrical connections to bonding pads on electrical devices are disclosed. In accordance with the principles of the present invention, to avoid damaging delicate electronic devices by any electrostatic discharge, a bonding tool tip must conduct electricity at a rate sufficient to prevent charge buildup, but not at so high a rate as to overload the device being bonded. In other words, it is desirable for the bonding tip to discharge slowly. The tip needs to discharge to avoid a sudden surge of current that could damage the part being bonded. For best results, a resistance in the tip assembly itself should range from $10^5$ to $10^{12}$ ohms. The tools must also have specific mechanical properties to function satisfactorily. The high stiffness and high abrasion resistance requirements have limited the possible material to ceramics (electrical non-conductors) or metals, such as tungsten carbide (electrical conductor).

In the present invention, bonding tool tips with the desired electrical conduction can be made with three different configurations.

First, the tools can be made from a uniform extrinsic semiconducting material which has dopant atoms in the appropriate concentration and valence states to produce sufficient mobile charge carrier densities (unbound electrons or holes) which will result in electrical conduction in the desired range. For example, polycrystalline silicon carbide uniformly doped with boron.

Second, the tools can be made by forming a thin layer of a highly doped semiconductor on an insulating core. In this case the core provides the mechanical stiffness and the semiconductor surface layer provides abrasion resistance and provides a charge carrier path from the tip to mount which will permit dissipation of electrostatic charge at an acceptable rate. For example, a diamond tip wedge that is ion implanted with boron.

Third, the tools can be made by forming a lightly doped semiconductor layer on a conducting core. The conducting core provides the mechanical stiffness and the semiconductor layer provides abrasion resistance and provides a charge carrier path from the tip to conducting core, which is electrically connected to the mount. The doping level is chosen to produce conductivity through the layer which will permit dissipation of electrostatic charge at an acceptable rate. For example, cobalt bonded tungsten carbide coated with titanium nitride carbide.

DETAILED DESCRIPTION OF THE INVENTION

Figure 1:
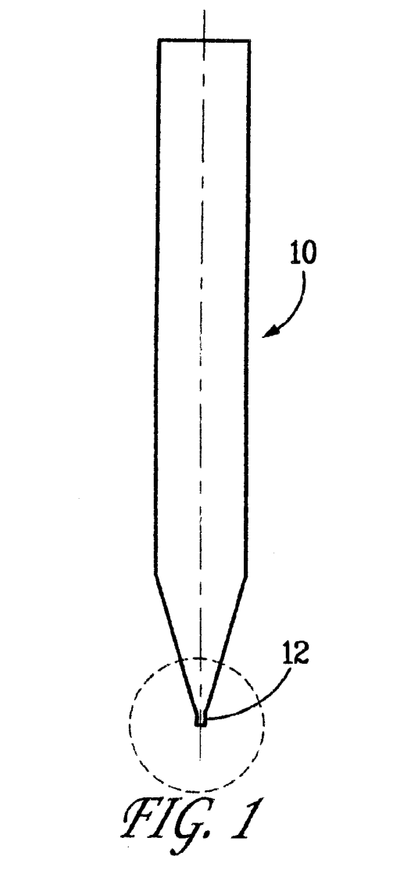
FIG. 1 is a cross-sectional view vastly enlarged of a capillary bonding tool tip.

FIG. 1 illustrates a typical capillary bonding tool 10. Such bonding tools are usually about one-half inch (12–13 mm) long and about one-sixteenth inch (1.6 mm) in diameter. The bonding tool tip 12 itself is usually from 3 to 10 mils (0.08 to 0.25 mm) long. Running the length of the tool itself, but not viewable in FIG. 1, is a tube hole which would accommodate a continuous fed length of gold wire (not shown).

Figure 2:
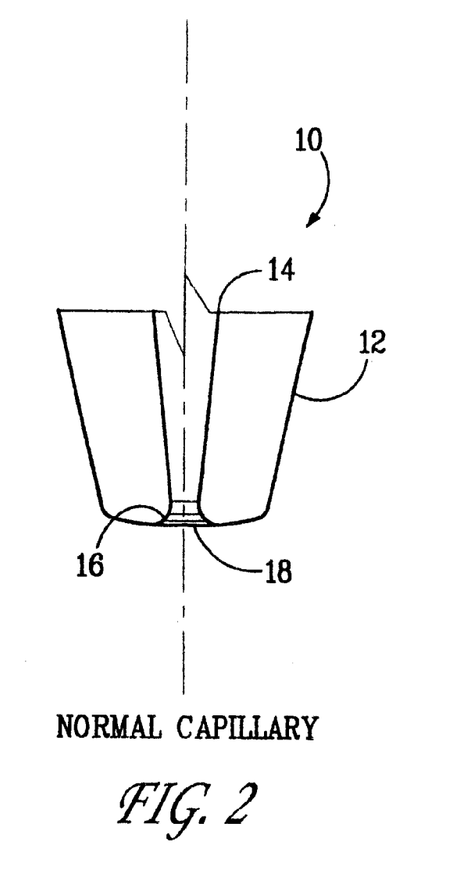
FIG. 2 is a cross-sectional view, vastly enlarged, of a capillary-type construction of the operating end or tip of a bonding tool.

FIG. 2 is a highly enlarged, cross-sectional view of the capillary bonding tool 10 as shown and described in FIG. 1. Only that portion of the bonding tool 10 shown within the dotted circle in FIG. 1 is shown in FIG. 2. Tool tip 12 has the hole tube 14 which may run the entire length of bonding tool 10. The exit hole 18 is where the wire (not shown) would exit the tool tip 12. If a ball is formed on the wire, the ball would be seen immediately adjacent the exit hole 18. The chamfer 16 at the exit hole 18 is there for at least two reasons. First, to accommodate a ball that has been formed at the end of the gold wire. Also, the chamfer surface 16 is provided to allow for smoother looping of the wire as the bonding tool 10 is moved from the bonding pad on an integrated circuit to the bonding pad (not shown) on a lead frame of an integrated circuit assembly. The wedge tool for disk drive bonding is used to capture the insulated wire, lay it on the head and ultrasonically bond it there.

Figure 3:
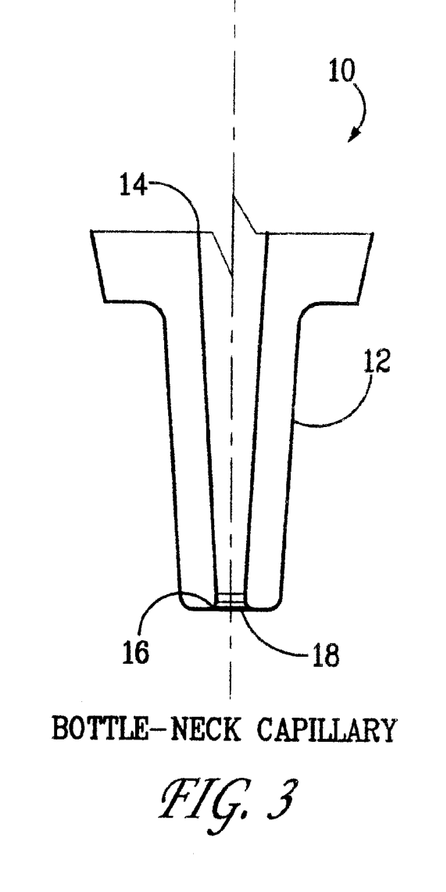
FIG. 3 is a cross-sectional view of a bottle-neck capillary bonding tool tip.

FIG. 3 is an alternative embodiment of a bonding tool 10 showing similar features, as the hole tube 14, chamfer surface 16, and exit hole 18. This bonding tool tip, named a bottle-neck capillary tip, is provided for narrower bond situations where the bonding pitch (distance between the centers of the bonding pads) is smaller and smaller as the dimensions of an integrated circuit get smaller, or the number of circuits on a chip get larger, but the die area remains more or less constant.

Figure 4:
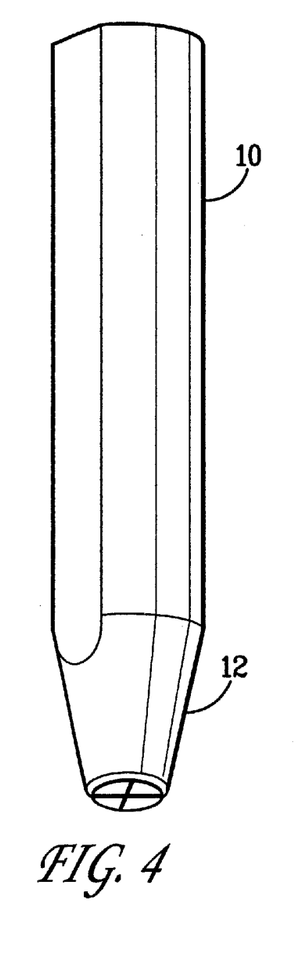
FIG. 4 is an isometric view of a wedge bonding tool tip.
Figure 5A:
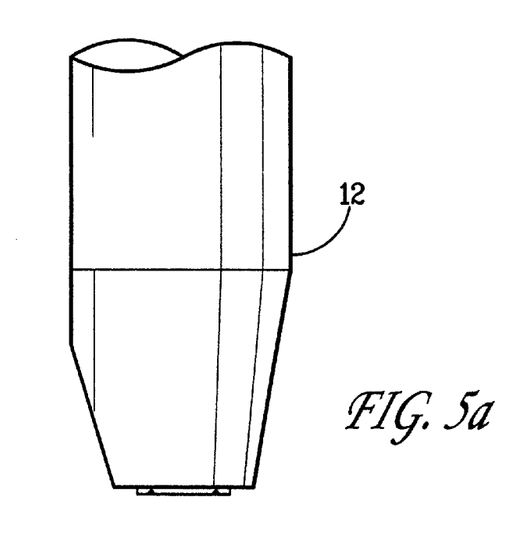
FIGS. 5a and 5b are top and front views, respectively, of the wedge design bonding tool tip as shown in conjunction with FIG. 4.
Figure 5B:
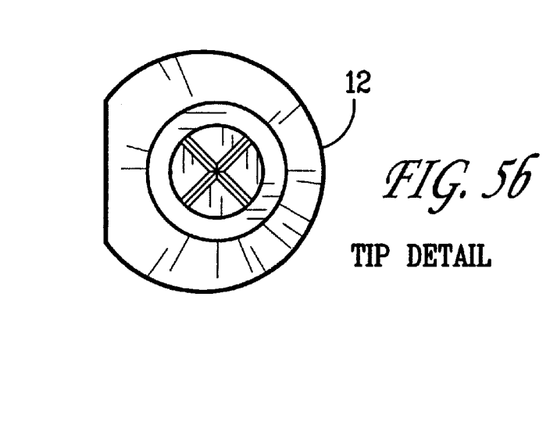

FIG. 4 shows still another type of bonding tool 10. This bonding tool is typically used with an integrated circuit die mounted on a lead frame (not shown). This is the case where the wires from the integrated circuit are not connected from the die to connections directly in an integrated circuit package, but from the integrated circuit die to a lead frame, which technology is well known to skilled practitioners in the art. The composition of the lead frame being different than the composition of an integrated circuit package, the tip 12 of the bonding tool 10 must be different to accommodate the different physical attributes of the integrated circuit lead frame, as seen in FIGS. 5a and 5b.

Figure 6A:
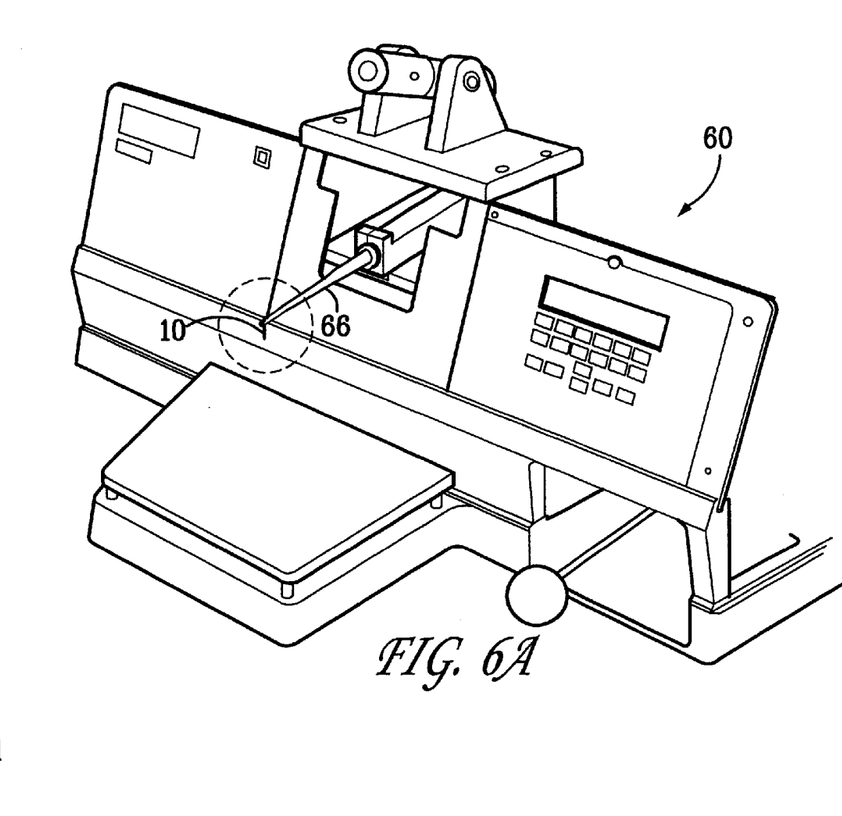
FIG. 6 is an isometric view of a typical commercial apparatus utilized in the wire bonding of a semiconductor integrated circuit chip or other apparatus.
Figure 6B:
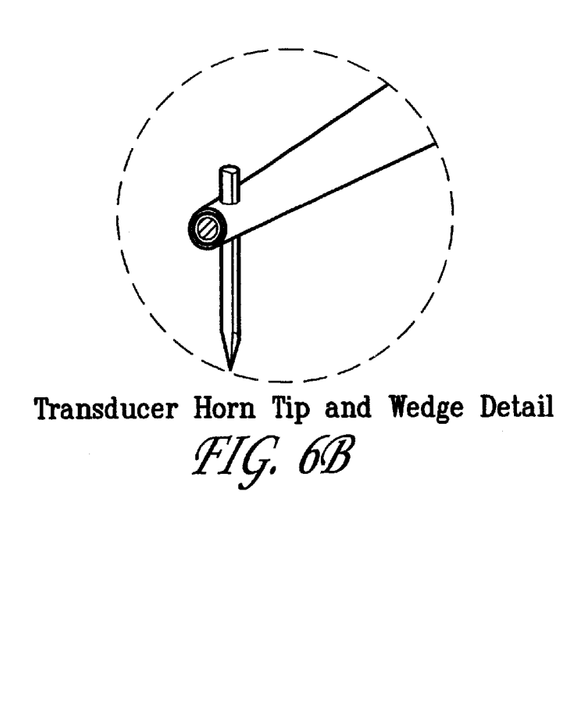

FIG. 6a illustrates a typical wire bonding machine 60 for use in bonding wire leads in magnetic disk drive units. Shown within the dotted circle is the bonding tool 10. The bonding tool 10 is mounted to arm 66 which is moved in the desired directions by the apparatus of wire bonding machine 60. Such a machine is available as Model 7400 from the West Bond Company in Anaheim, Calif.

Typical bonding tips available on the market today are made of an insulator of alumina ($Al_2O_3$), sometimes termed aluminum oxide. This is a very hard compound which has been used on commercial machines with success as it provides a reasonably long life in use as a wire bonding tool. To insure that it is an insulator no conductive binders are used in these bonding tips. However, as stated previously, the problem has existed that an electrostatic discharge from the bonding tool making contact with the bonding pad of the desired circuit can damage the very circuit it is wiring up.

However, in accordance with the principles of the present invention, to avoid damaging delicate electronic devices by this electrostatic discharge, a bonding tool tip must conduct electricity at a rate sufficient to prevent charge buildup, but not at so high a rate as to overload the device being bonded. It has been determined that the tool must have electrical conduction greater than one ten-billionth of a mho (i.e. $>1\times 10$ raised to the minus 12th power reciprocal ohms) but its electrical conductivity must be less than one one-hundred thousandth of a mho (i.e. $<1\times 10$ raised to the minus fifth power reciprocal ohms). The resistance should be low enough so that the material is not an insulator, not allowing for any dissipation of charge and high enough so that it is not a conductor, allowing a current flow. For best results, a resistance in the tip assembly itself should range from $10^5$–$10^{12}$ ohms. For example, for today's magnetic recording heads 5 milliamps of current will damage them. Preferably, for today's magnetic recording heads, no more than 2 to 3 milliamps of current should be allowed to pass through the tip to the head.

The tools must also have specific mechanical properties to function satisfactorily. The high stiffness and high abrasion resistance requirements have limited the possible material to ceramics (electrical non-conductors) or metal, such as tungsten carbide (electrical conductor). The tip should have a Rockwell hardness of about 25 or above, preferably of about 32 or above. The tip needs to be able to last for at least two bondings.

In the present invention, bonding tool tips with the desired electrical conduction can be made with three different configurations.

First, the tools can be made from a uniform extrinsic semiconducting material which has dopant atoms in the appropriate concentration and valence states to produce sufficient mobile charge carrier densities (unbound electrons or holes) which will result in electrical conduction in the desired range. For example, polycrystalline silicon carbide uniformly doped with boron.

Second, the tools can be made by forming a thin layer of a highly doped semiconductor on an insulating core. In this case the core provides the mechanical stiffness and the semiconductor surface layer provides abrasion resistance and provides a charge carrier path from the tip to the mount, which will permit dissipation of electrostatic charge at an acceptable rate. For example, a diamond tip wedge that has a surface that is ion implanted with boron or a doped ceramic.

Third, the tools can be made by forming a lightly doped semiconductor layer on a conducting core. The conducting core provides the mechanical stiffness and the semiconductor layer provides abrasion resistance and provides a charge carrier path from the tip to conducting core, which is electrically connected to the mount. The doping level is chosen to produce conductivity through the layer which will permit dissipation of electrostatic charge at an acceptable rate. For example, cobalt bonded tungsten carbide coated with titanium nitride carbide.

Figures 7, 8:
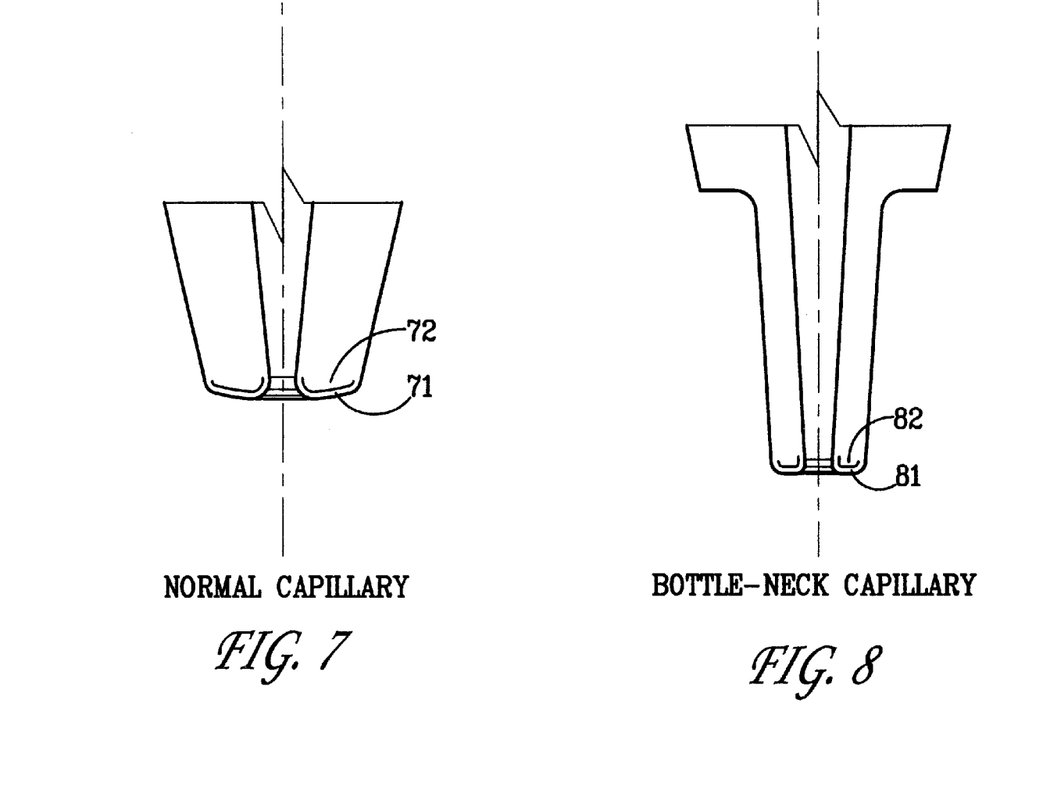
FIG. 7 a cross section of embodiments of FIG. 2 having two layers.
FIG. 8 a cross section of embodiments of FIG. 3 having two layers.
Figure 9:
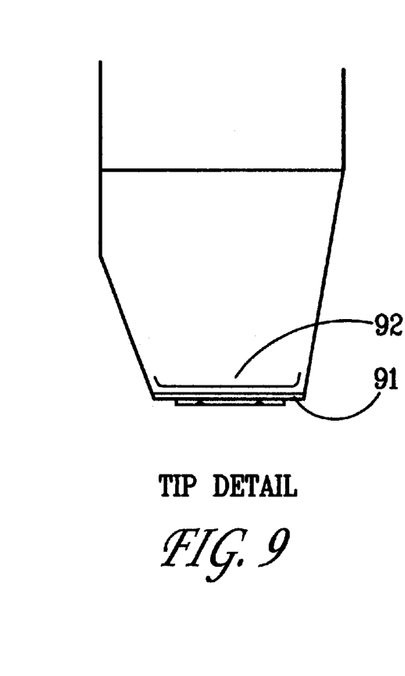
FIG. 9 a cross section of embodiments of FIG. 5 having two layers.

FIGS. 7, 8 and 9 illustrate the two-layered structure of the last two configurations. This structure is not intended to be specific to the type of tool tip. Rather, it could be used for any bonding tool tip. In the second and third configurations, the outer layers are labeled 71, 81 and 91 and the cores are labeled 72, 82 and 92. In the second configuration, mentioned above, layers 71, 81 and 91 are highly doped semiconductor and the cores 72, 82 and 92 are insulators. In the third configuration, mentioned above, layers 71, 81 and 91 are lightly doped semiconductor and the cores 72, 82 and 92 are conductors. No significance should be attached to the relative thickness or scale of the portions of the layer 71. Layer 71 may or may not have a uniform thickness.

Dissipative tools can be manufactured by any of the following methods.

1. Mixing, molding and sintering reactive powders. Fine particles of the desired composition are mixed with organic and inorganic solvents, dispersants, binders, and sintering aids are then molded into oversize wedges. The pieces are carefully dried, and heated slowly to remove the binders and dispersants and then heated to a high enough temperature so that the individual particles sinter together into a solid structure with low porosity. The heat-treating atmosphere is chosen to facilitate the removal of the binder at a low temperature and to control the valence of the dopant atoms at the higher temperature and while cooling. After cooling, the pieces may be machined to achieve the required tolerances. The pieces may then be treated to produce the desired surface layer by ion implementation, vapor deposition, chemical vapor deposition, physical deposition, electro-plating deposition, neutron bombardment, or combinations of the above. The pieces may be subsequently heat treated in a controlled atmosphere to produce the desired layer properties through diffusion, recrystalization, dopant activation, or valence changes of metallic ions.

2. Hot pressing reactive powders. Fine particles of the desired composition are mixed with binders and sintering aids and then pressed in a mold at a high enough temperature to cause consolidation and binding of the individual particles into a solid structure with low porosity. The hot pressing atmosphere is chosen to control the valence of the dopant atoms. After cooling and removal from the hot press, the pieces may be machined to achieve the required tolerances. The pieces may then be treated to produce the desired surface layer by ion implantation, vapor deposition, chemical vapor deposition, physical deposition, electo-plating deposition, neutron bombardment or combinations of the above. The pieces may subsequently be heat treated in a controlled atmosphere to produce the desired layer properties through diffusion, recrystalization, dopant activation, or valence changes of metallic ions.

3. Fusion casting. Metals of the desired composition are melted in a non-reactive crucible then cast into an ingot. The ingot is then rolled, extruded, drawn, pressed, heat treated in a suitable atmosphere and chemically treated. The pieces are then machined to achieve the required tolerances. The metallic pieces are then heat treated to produce the desired surface layer by vapor deposition, chemical vapor deposition, physical deposition, electo-plating deposition, or combinations of the above. The pieces may be subsequently heat treated in a controlled atmosphere to produce the desired layer properties through diffusion, recrystalization, dopant activation, or valence changes of metallic ions.

The invention further includes that the layer used in the bonding process could be the following composition of matter. More specifically, a formula for dissipated ceramic comprising alumina (aluminum oxide $Al_2O_3$) and zirconia (zirconium oxide $ZrO_2$) and other elements. This mixture is both somewhat electrically conductive and mechanically durable. The tip of a bonding tool will be coated with this material or it could be made completely out of this material The shape of the tip may be wedge or circular shaped as shown and described in the earlier FIGS. 1 to 5.

One actual sample was constructed with the following elements:

ELEMENT
Iron
Oxygen
Sodium
Carbon
Zirconium
Silicon
Aluminum
Yttrium

While the range of alumina could extend from 15% to 85% and the range of zirconia from 15% to 85%, another sample included alumina at 40% and zirconia at 60%.

The bonding tip of the present invention could be used for any number of different types of bonding. Two examples are ultrasonic and thermal bonding.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

What is claimed is:

1. A tip having a dissipative material for use in wire bonding machines for connecting leads on integrated circuit bonding pads, wherein said dissipative material has a resistance low enough to prevent a discharge of charge to a device being bonded and high enough to avoid current flow large enough to damage said device being bonded.

2. A tip as in claim 1, having a resistance in the range of $10^5$ to $10^{12}$ ohms.

3. A tip as in claim 1, having a high enough stiffness to resist bending when hot and a high enough abrasiveness so as to function for at least two uses.

4. A tip as in claim 1, wherein said material is an extrinsic semiconducting material which has dopant atoms in the appropriate concentration and valence states to produce said resistance.

5. A tip as in claim 4 wherein said material comprises a polycrystalline silicon carbide uniformly doped with boron.

6. A tip as in claim 1 wherein said dissipative material comprises a doped semiconductor formed on an insulating core.

7. A tip as in claim 6, wherein said insulating core is diamond and said doped semiconductor is an outer surface of said diamond that is ion implanted with boron.

8. A tip as in claim 1 wherein said material is a doped semiconductor formed on a conducting core.

9. A tip having
   a dissipative material for use in wire bonding machines for connecting leads on integrated circuit bonding pads, wherein
   said dissipative material is a doped semiconductor which is titanium nitride carbide, has a resistance low enough to prevent a discharge of charge to a device being bonded and high enough to avoid current flow large enough to damage said device being bonded, and is formed on a conducting core of cobalt bonded tungsten carbide.

10. A dissipative ceramic for use in capillary wedge-type wire bonding machines for connecting leads on integrated circuit bonding pads, wherein said dissipative ceramic is electrically dissipative.

11. The dissipative ceramic of claim 10, wherein said electrically dissipative ceramic comprises alumina ($Al_2O_3$).

12. The dissipative ceramic of claim 10, comprising zirconia ($ZrO_2$).

13. The dissipative ceramic of claim 10, comprising alumina ($Al_2O_3$) and zirconia ($ZrO_2$).

14. The dissipative ceramic of claim 13, wherein the range of alumina is from 15% to 85% and the range of zirconia is from 15% to 85%.

15. The dissipative ceramic of claim 13, having 40 percent alumina and 60 percent zirconia with other additives.

16. A dissipative ceramic comprising aluminum oxide ($A_2O_3$) zirconium oxide ($ZrO_2$).

17. The dissipative ceramic of claim 16, wherein the range aluminum oxide is from 15% to 85% and the range of zirconium oxide is from 15% to 85%.

18. The dissipative ceramic of claim 16, having of about 40 percent aluminum oxide and about 60 percent zirconium with other additives.

19. A method of manufacturing a dissipative bonding tip comprising:
  forming a dissipative material as a bonding tip that has a resistance low enough to prevent a discharge of charge to a device being bonded and high enough to avoid current flow large enough to damage said device being bonded.

20. The method of claim 19 wherein the step of forming includes mixing, molding and sintering reactive powders.

21. The method of claim 19 wherein the step of forming includes hot pressing reactive powders.

22. The method of claim 19 wherein the step of forming includes fusion casting.

23. The method of claim 19, wherein said dissipative material has a resistance in the range of $10^5$ to $10^{12}$ ohms.

24. The method of claim 19, wherein said dissipative material has a high enough stiffness to resist bending when hot, and has a high enough abrasiveness to function for at least two uses.

25. The method of claim 19, wherein said dissipative material is an extrinsic semiconducting material which has dopant atoms in the appropriate concentration and valence states to produce said resistance.

26. The method of claim 19, wherein said dissipative material comprises a polycrystalline silicon carbide uniformly doped with boron.

27. The method of claim 19, wherein said dissipative material comprises a doped semiconductor, and said step of forming includes forming said doped semiconductor on an insulating core.

28. The method of claim 27, wherein said insulating core is diamond and said doped semiconductor is an outer surface of said diamond that is ion implanted with boron.

29. The method of claim 19, wherein said dissipative material comprises a doped semiconductor, and said step of forming includes forming said doped semiconductor on a conducting core.

30. A method of manufacturing a dissipative bonding tip comprising:
  forming a dissipative material having at least a doped semiconductor that is titanium nitride carbide, as a bonding tip that has a resistance low enough to prevent a discharge of charge to a device being bonded and high enough to avoid current flow large enough to damage said device being bonded,
  wherein said step of forming includes forming said doped semiconductor on a conducting core of cobalt bonded tungsten carbide.

31. The method of claim 19 wherein the step of forming comprises:
  mixing fine particles of a composition appropriate for forming said dissipative material with a solvent, a dispersant, a binder, and a sintering aid to form a mixture;
  molding the mixture into at least one wedge;
  drying the at least one wedge;
  providing a heat-treating atmosphere that facilitates removal of the binder at a low temperature and that controls the valence of the dopant atoms;
  heating the at least one wedge at a temperature appropriate to remove the binder and the dispersant;
  heating the at least one wedge to a high enough temperature to sinter the particles together into a solid structure having low porosity; and
  cooling the solid structure.

32. The method of claim 19 wherein the step of forming comprises:
  forming a solid structure; and
  machining the solid structure to achieve a required size and shape within a required tolerance.

33. The method of claim 19 wherein the step of forming comprises:
  forming a solid structure; and
  treating the solid structure by ion implantation, vapor deposition, chemical vapor deposition, physical deposition, electro-plating deposition, or neutron bombardment to produce a surface layer.

34. The method of claim 33 wherein the step of forming further comprises:
  producing the desired layer properties within said surface layer by heating the solid structure in a controlled atmosphere to induce diffusion, recrystalization, dopant activation, or valence changes of metallic ions.

35. The method of claim 19 wherein the step of forming comprises:
  mixing fine particles of a composition appropriate for forming said dissipative material with binders and sintering aids into a mixture;
  choosing a hot pressing atmosphere to control a valence of dopant atoms;
  pressing the mixture in a mold at a temperature high enough to cause consolidation and binding of the particles into a solid structure having low porosity; and
  cooling and removing the solid structure from the mold.

36. The method of claim 19 wherein the step of forming comprises:
  melting metals of a composition appropriate for forming said dissipative material in a non-reactive crucible;
  casting the melted metals into an ingot;
  rolling the ingot into a rolled ingot;
  extruding the rolled ingot into an extruded material;
  drawing the extruded material into a drawn material;
  pressing the drawn material in a pressed material; and
  heating the pressed material.

37. A method of using a bonding tip, comprising:
  bonding a device using a bonding tip made with a dissipative material that has a resistance low enough to prevent a discharge of charge to said device and high enough to avoid current flow large enough to damage said device.

38. The method of claim 37, wherein said dissipative material has a resistance in the range of $10^5$ to $10^{12}$ ohms.

39. The method of claim 37, wherein said dissipative material has a high enough stiffness to resist bending when hot and has a high enough abrasiveness to function for at least two uses.

40. The method of claim 37, wherein said dissipative material is an extrinsic semiconducting material which has dopant atoms in appropriate concentration and valence states to produce said resistance.

41. The method of claim 37 wherein said dissipative material comprises a polycrystalline silicon carbide uniformly doped with boron.

42. The method of claim 37, wherein said dissipative material comprises a doped semiconductor formed on an insulating core.

43. The method of claim 42, wherein said insulating core is diamond and said doped semiconductor is an outer surface of said diamond that is ion implanted with boron.

44. The method of claim 37 wherein said dissipative material is a doped semiconductor formed on a conducting core.

45. A method of using a bonding tip, comprising:
   bonding a device using a bonding tip made with a dissipative material that is a doped semiconductor of titanium nitride carbide and has a resistance low enough to prevent a discharge of charge to said device and high enough to avoid current flow large enough to damage said device, wherein said dissipative material is formed on a conducting core of cobalt bonded tungsten carbide.

46. A device comprising:
   a bonding tip having a dissipative material
      that is positioned to come in contact with a device being bonded during bonding,
      in which a current is allowed to flow that is produced by static charge generated during bonding, and
      that has a resistance low enough to prevent a discharge of charge to a device being bonded and high enough so that the current flow is not large enough to damage said device being bonded.

47. The device of claim 46 wherein the current flow allowed is no more than 3 milliamps.

48. A method of manufacturing a dissipative bonding tip comprising:
   forming a bonding tip having a dissipative material
      that is positioned to come in contact with a device being bonded during bonding,
      in which a current is allowed to flow that is produced by static charge generated during bonding, and
      that has a resistance low enough to prevent a discharge of charge to a device being bonded and high enough so that the current flow is not large enough to damage said device being bonded.

49. The method of claim 46 wherein the current flow allowed is no more than 3 milliamps.

50. A method of bonding using a dissipative bonding tip comprising:
   providing a bonding tip having a dissipative material that has a resistance low enough to prevent a discharge of charge to a device being bonded and high enough so that the current flow is not large enough to damage a device being bonded,
   positioning the bonding tip so that the dissipative material electrically couples with the device being bonded during bonding,
   forming a bond on the device being bonded, and
   allowing a current flow that is produced by static charge generated by the bonding.

51. The method of claim 46 wherein the current flow allowed is no more than 3 milliamps.

* * * * *

UNITED STATES PATENT AND TRADEMARK OFFICE
CERTIFICATE OF CORRECTION

PATENT NO. : 6,354,479 B1  
DATED : March 12, 2002  
INVENTOR(S) : Steven Frederick Reiber and Mary Louise Reiber It is certified that error appears in the above-identified patent and that said Letters Patent is hereby corrected as shown below:

<u>Title page,</u>
Delete [73] Assignee: SJM Technologies, Mountain View, CA (US)."

Signed and Sealed this

Twenty-seventh Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,354,479 B1  Page 1 of 1
APPLICATION NO. : 09/514454
DATED : March 12, 2002
INVENTOR(S) : Reiber et al.

It is certified that error appears in the above-identified patent and that said Letters Patent is hereby corrected as shown below:

In Claim 49 at Column 10, Line 14, that portion of the claim reading "The method of claim 46" should read -- The method of clam 48 --

In Claim 51 at Column 10, Line 29, that portion of the claim reading "The method of claim 46" should read -- The method of claim 50 --

Signed and Sealed this

Twenty-ninth Day of January, 2008

JON W. DUDAS
*Director of the United States Patent and Trademark Office*

Disclaimer

6,354,479—Steven Frederick Reiber, Sunnyvale; Mary Louise Reiber, Los Altos, both of CA (US). DISSIPATIVE CERAMIC BONDING TIP. Patent Dated March 12, 2002. Disclaimer filed December 7, 2009 by Co-Inventor and Co-Owner, Steven Frederick Reiber.

Hereby enters this disclaimer to claims 20-22, 25-31, 33-36, 40-45 of said patent.

(*Official Gazette, June 15, 2010*)